US012577423B2

(12) United States Patent
Lysien et al.

(10) Patent No.: US 12,577,423 B2
(45) Date of Patent: Mar. 17, 2026

(54) METALLIC NANOPARTICLE COMPOSITION AND METHOD OF DISPENSING METALLIC NANOPARTICLE COMPOSITION

(71) Applicant: XTPL S.A., Wrocław (PL)

(72) Inventors: Mateusz Lysien, Zywiec (PL); Ludovic Schneider, Wroclaw (PL); Lukasz Witczak, Lodz (PL); Karolina Fiaczyk, Wroclaw (PL); Filip Granek, Mrozow (PL)

(73) Assignee: XTPL S.A., Wroclaw (PL)

( * ) Notice: Subject to any disclaimer, the term of this patent is extended or adjusted under 35 U.S.C. 154(b) by 623 days.

(21) Appl. No.: 17/998,381

(22) PCT Filed: May 11, 2021

(86) PCT No.: PCT/IB2021/054005
§ 371 (c)(1),
(2) Date: Nov. 10, 2022

(87) PCT Pub. No.: WO2021/229435
PCT Pub. Date: Nov. 18, 2021

(65) Prior Publication Data
US 2023/0183512 A1       Jun. 15, 2023

Related U.S. Application Data

(60) Provisional application No. 63/023,596, filed on May 12, 2020.

(51) Int. Cl.
*C09D 11/52* (2014.01)
*B22F 1/054* (2022.01)
(Continued)

(52) U.S. Cl.
CPC .............. *C09D 11/52* (2013.01); *B22F 1/054* (2022.01); *B22F 1/0545* (2022.01); *B22F 1/056* (2022.01);
(Continued)

(58) Field of Classification Search
CPC ..... C09D 11/52; C09D 11/033; C09D 11/037; C09D 11/106; C09D 11/322; C09D 11/36;
(Continued)

(56) References Cited

U.S. PATENT DOCUMENTS

| | | |
|---|---|---|
| 10,201,852 B2 | 2/2019 | Suganuma et al. |
| 10,563,079 B2 | 2/2020 | Salami et al. |

(Continued)

FOREIGN PATENT DOCUMENTS

| | | | |
|---|---|---|---|
| CN | 103194117 A | * | 7/2013 |
| CN | 104140717 A | * | 11/2014 |

(Continued)

OTHER PUBLICATIONS

Yano et al. "Synthesis of Cu Nanoparticles Using Copper Carbonate as Cu Source Toward Versatile Applications" Journal of Nanoscience and Nanotechnology vol. 18,5101-5104, 2018 (Year: 2018).*
(Continued)

*Primary Examiner* — Coris Fung
*Assistant Examiner* — Caroline D. Liott
(74) *Attorney, Agent, or Firm* — K&L Gates LLP

(57) ABSTRACT

A metallic nanoparticle composition includes metallic nanoparticles and a non-aqueous polar protic solvent. The non-aqueous polar protic solvent has two hydroxyl groups, a boiling point of at least 280° C. at 760 mm Hg, and a viscosity in a range of 45 cP to 65 cP at 20° C. Polyvinylpyrrolidone (PVP) is present on the metallic nanoparticle surfaces. A concentration of metals in the metallic nanopar-
(Continued)

10 ticle composition is in a range of 60 wt % to 90 wt % and a concentration, in aggregate, of solvents having a boiling point of less than 280° C. at 760 mm Hg in the metallic nanoparticle composition does not exceed 3 wt %.

22 Claims, 13 Drawing Sheets

(51) Int. Cl.

| | |
|---|---|
| *B22F 1/0545* | (2022.01) |
| *B22F 1/102* | (2022.01) |
| *B22F 1/107* | (2022.01) |
| *B41J 2/175* | (2006.01) |
| *C09D 11/033* | (2014.01) |
| *C09D 11/037* | (2014.01) |
| *C09D 11/106* | (2014.01) |
| *C09D 11/322* | (2014.01) |
| *C09D 11/36* | (2014.01) |
| *C09D 11/38* | (2014.01) |
| *H05K 1/09* | (2006.01) |
| *H05K 3/12* | (2006.01) |
| *B22F 9/24* | (2006.01) |

(52) U.S. Cl.
    CPC .............. *B22F 1/102* (2022.01); *B22F 1/107* (2022.01); *B41J 2/17506* (2013.01); *C09D 11/033* (2013.01); *C09D 11/037* (2013.01); *C09D 11/106* (2013.01); *C09D 11/322* (2013.01); *C09D 11/36* (2013.01); *C09D 11/38* (2013.01); *H05K 1/097* (2013.01); *H05K 3/125* (2013.01); *B22F 9/24* (2013.01); *B22F 2301/10* (2013.01); *B22F 2301/255* (2013.01); *B22F 2998/10* (2013.01); *B22F 2999/00* (2013.01)

(58) Field of Classification Search
    CPC ........ C09D 11/38; B22F 1/054; B22F 1/0545; B22F 1/056; B22F 1/102; B22F 1/107; B22F 9/24; B22F 2301/10; B22F 2301/255; B22F 2998/10; B22F 2999/00; B41J 2/17506; B41J 2/175; H05K 1/097; H05K 3/125; H01B 1/22
    See application file for complete search history.

(56) References Cited

U.S. PATENT DOCUMENTS

| | | | | |
|---|---|---|---|---|
| 2006/0189113 A1* | 8/2006 | Vanheusden | .......... | B22F 1/0545 |
| | | | | 257/E21.174 |
| 2008/0034921 A1* | 2/2008 | Vanheusden | .......... | B22F 1/0545 |
| | | | | 75/362 |
| 2014/0174312 A1* | 6/2014 | Wang | .................... | C09K 13/06 |
| | | | | 524/378 |
| 2015/0191610 A1* | 7/2015 | Matsushita | ............ | H05K 1/095 |
| | | | | 252/514 |
| 2019/0053546 A1* | 2/2019 | Nakao | .................... | H05K 3/12 |

FOREIGN PATENT DOCUMENTS

| | | | | | |
|---|---|---|---|---|---|
| JP | 2010285695 A | * | 12/2010 | | |
| JP | 2015206004 A | * | 11/2015 | | |
| KR | 20080013787 A | * | 2/2008 | ............. | C09D 11/52 |
| WO | WO-2014126400 A1 | * | 8/2014 | ........... | C09D 11/033 |
| WO | WO-2018150697 A1 | * | 8/2018 | ............... | H05K 3/12 |
| WO | 2021229435 A1 | | 11/2021 | | |

OTHER PUBLICATIONS

Machine English translation of Chung Kwang Choon, KR-20080013787-A, Feb. 13, 2008. (Year: 2008).*
Machine English translation of Mori Kensaku, JP-2010285695-A, Dec. 24, 2010. (Year: 2010).*
Machine English translation of Tang, Yao, CN-103194117-A, Jul. 10, 2013. (Year: 2013).*
Machine English translation of Zhang, Xing-ye, CN-104140717-A, Nov. 12, 2014. (Year: 2014).*
Machine English translation of Choi, Min Young, WO-2014126400-A1, Aug. 21, 2014. (Year: 2014).*
Machine English translation of Mukai Hiroshi, JP-2015206004-A, Nov. 19, 2015. (Year: 2015).*
Machine English translation of Shingai, Yuki, WO-2018150697-A1, Aug. 23, 2018. (Year: 2018).*
International Search Report and Written Opinion for International PCT Application No. PCT/IB2021/054005, dated Aug. 6, 2021.
Zhang et al., Silver nanopaste: Synthesis, reinforcements and application, International Journal of Heat and Mass Transfer (Jul. 14, 2018), 127:1048-1069 (DOI: 10.1016/j.ijheatmasstransfer.2018.06.083).

* cited by examiner 252   250   256

250   256   254

METALLIC NANOPARTICLE COMPOSITION AND METHOD OF DISPENSING METALLIC NANOPARTICLE COMPOSITION

CROSS-REFERENCE TO RELATED APPLICATIONS

This application is a U.S. National Stage Entry under 35 U.S.C. § 371 of International Patent Application No. PCT/IB2021/054005, entitled METALLIC NANOPARTICLE COMPOSITION AND METHOD OF DISPENSING METALLIC NANOPARTICLE COMPOSITION, filed May 11, 2021, which claims benefit under 35 U.S.C. § 119(e) to U.S. Provisional Application No. 63/023,596, filed May 12, 2020, the entire disclosures of which are hereby incorporated by reference herein.

BACKGROUND

Recent progress in metallic nanoparticle compositions and printing apparatuses have enabled dispensing metallic nanoparticle compositions on substrates to form metallic nanoparticle lines having line widths in a range of about 2 $\mu$m to 20 $\mu$m. Metallic nanoparticles such as silver nanoparticles and copper nanoparticles can be used in these compositions. In a typical printing apparatus, a metallic nanoparticle composition is dispensed through a glass or stainless steel capillary tube. The metallic nanoparticle compositions tend to clog in the capillary tubes; hence, the capillary tubes need to be replaced frequently. Improved metallic nanoparticle compositions that clog less frequently in the capillary tubes is desired. In an effort to reduce the occurrence of clogging, pressure is applied such that some of the metallic nanoparticle composition always protrudes from the outlet end of the capillary tube. As a result, when a printing apparatus dispenses a line, a first portion of the line has a line width that is much greater than a line width of the steady-state portion of the line. Improved metallic nanoparticle compositions that enable more lines of more uniform line widths are desired.

SUMMARY OF THE INVENTION

In one aspect, a metallic nanoparticle composition includes metallic nanoparticles and a first non-aqueous polar protic solvent having two hydroxyl groups, a first boiling point of at least 280° C. at 760 mm Hg, and a first viscosity in a range of 45 cP to 65 cP at 20° C. A concentration of the metallic nanoparticles in the metallic nanoparticle composition is in a range of 60 wt % to 90 wt %. A concentration, in aggregate, of solvents having a boiling point of less than 280° C. at 760 mm Hg in the metallic nanoparticle composition does not exceed 3 wt %. Polyvinylpyrrolidone (PVP) is present on the metallic nanoparticle surfaces. The first non-aqueous polar protic solvent can be triethylene glycol or tetraethylene glycol.

In another aspect, the metallic nanoparticle composition additionally includes a second non-aqueous polar protic solvent having two hydroxyl groups, a second boiling point of at least 280° C. at 760 mm Hg, and a second viscosity in a range of 45 cP to 65 cP at 20° C. The second non-aqueous polar protic solvent is different from the first non-aqueous polar protic solvent.

In yet another aspect, a method of dispensing a metallic nanoparticle composition on a substrate is disclosed. The method includes the following steps: providing a cartridge, which includes a pneumatic port at a first end, an outlet port at a second end opposite the first end; providing a capillary tube; coupling a tube inlet of the capillary tube to the outlet port of the cartridge; injecting the metallic nanoparticle composition into the cartridge; coupling the pneumatic port to a regulated pneumatic system; and extruding the metallic nanoparticle composition through the capillary tube under actuation by the regulated pneumatic system.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to a metallic nanoparticle composition and a method of dispensing a metallic nanoparticle composition.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
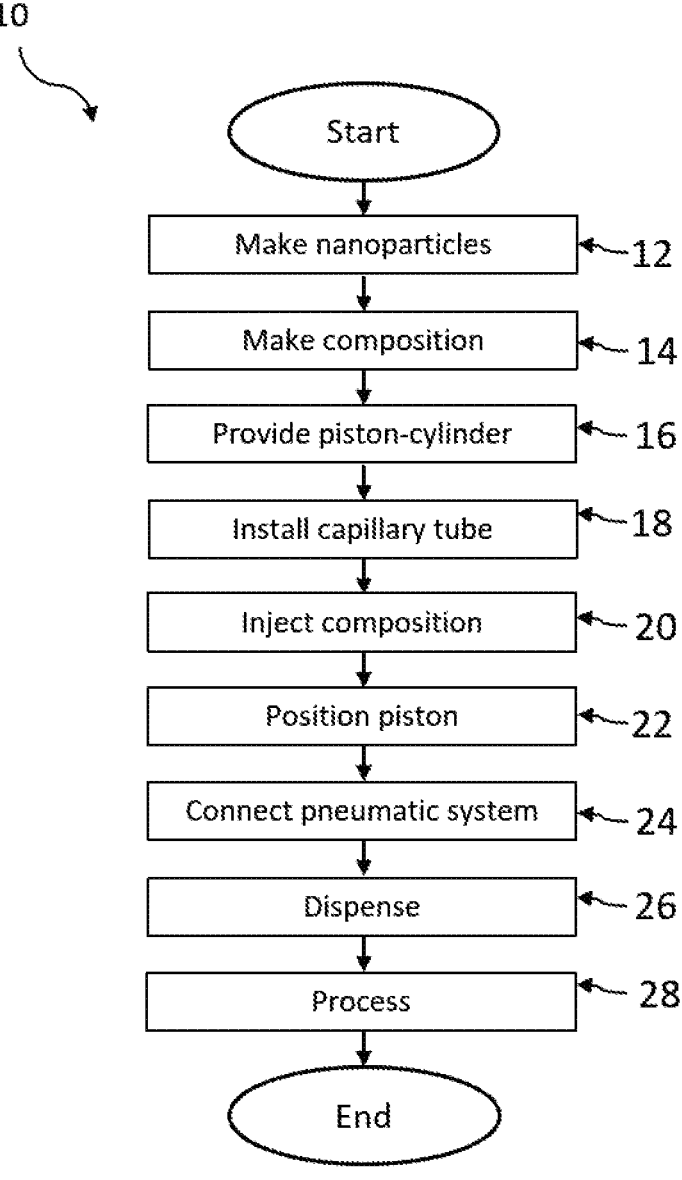
FIG. 1 is a flow diagram of a process of forming a printed conductive feature on a substrate.

FIG. 1 is a flow diagram of a process 10 of forming a conductive feature on a printable surface of a substrate. In the present disclosure, metallic nanoparticles are used to form the conductive features. Among various metallic nanoparticles, silver nanoparticles and copper nanoparticles are important because of the high electrical conductivity of silver and copper. For example, silver nanoparticles having an average particle size in a range of 20 nm to 80 nm, and copper nanoparticles having an average particle size in a range of 60 nm to 160 nm have been considered. Because of the lower cost of copper compared to silver, it may be preferable to use copper nanoparticles for achieving greater line widths (wider lines).

At step 12, the metallic nanoparticles are made. Generally, the synthesis of metallic nanoparticles in solution employs three components: (1) metal precursors (e.g., $AgNO_3$ for silver nanoparticles and $Cu(NO_3)_2$ for copper nanoparticles); (2) reducing agents (e.g., ethylene glycol for silver nanoparticles and sodium hypophosphite for copper nanoparticles); and (3) stabilizing (capping) agents (e.g., polyvinylpyrrolidone). Polyvinylpyrrolidone, abbreviated as PVP, is soluble in water and other polar solvents. When PVP is effectively used as a dispersant, stable colloidal silver nanoparticles or copper nanoparticles covered (capped) with PVP polymer can be obtained in small size (<250 nm) because the PVP reduces the aggregation of the silver or copper nanoparticles. The synthesis of silver nanoparticles and copper nanoparticles is described in detail in the Examples hereinbelow.

The average size of the silver nanoparticles can be controlled to within a range of 20 nm to 80 nm. The average size of the copper nanoparticles can be controlled to within a range of 60 nm to 160 nm. The average particle size and dispersity can be controlled by controlling thermodynamic and kinetic reaction parameters. Reaction temperature, temperature ramp, and reaction time are the important thermodynamic reaction parameters. In second case, the reagents addition rate of adding reagents and molar ratio of used metal precursor to stabilizing agent (PVP) are the important kinetic reaction parameters. An appropriate combination of these parameters leads to obtaining nanoparticles that exhibit the desired properties of small particles size, low dispersity, and high dispersion stability (low occurrence of aggregation).

At step 14, a metallic nanoparticle composition is made from the metallic nanoparticles from step 12. The preparation of metallic nanoparticle compositions is described in detail in the Examples hereinbelow. Generally, the nanoparticles are separated, to remove impurities and excess PVP, and dispersed in a solvent mixture including a first solvent and an optional second solvent. The metallic nanoparticle composition may optionally include additives to better control its physicochemical properties. These additives include surfactants, binders, adhesion promoters, and antifoaming agents. We have found that the concentration of such additives should not exceed 3% by weight in the metallic nanoparticle composition.

Figure 8:
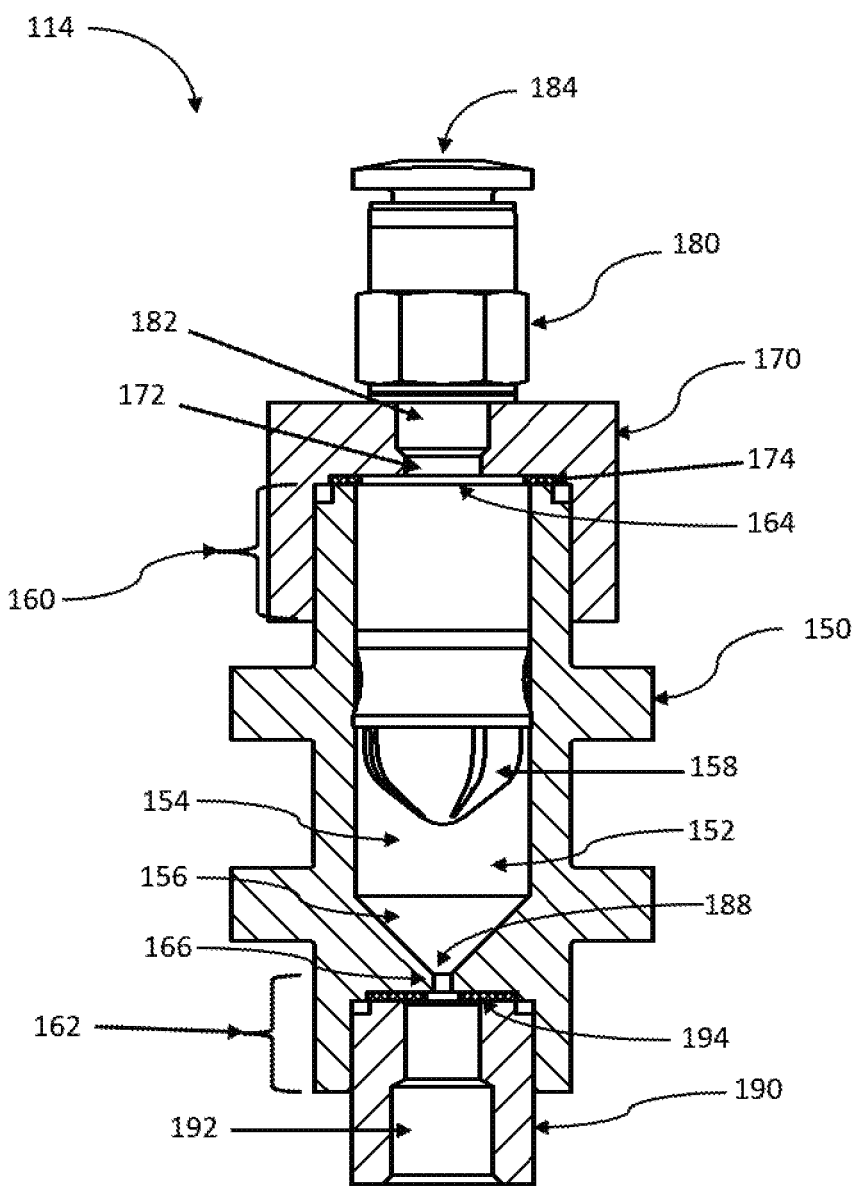
FIG. 8 is a schematic side view and partial cross-sectional view of a piston-cylinder assembly.

At step 16, a piston-cylinder assembly is provided. More generally, the piston-cylinder assembly is sometimes referred to as a printer cartridge. A schematic side view and partial cross-sectional view of an exemplary piston-cylinder assembly 114 is shown in FIG. 8. In the example shown, the piston-cylinder assembly 114 includes a cylinder 150, a cylinder cover 170, a pneumatic connector 180, and an intermediate sealing sleeve 190. The cylinder 150 is shown in cross-section to show a cylindrical cavity portion 154 and a conical cavity portion 156. A piston 158 is located inside cylinder 150. The cylinder 150 has a first end (top end) portion 160 and a second end (bottom end) portion 162 opposite the first end. The cylinder cover 170 is sealably mated to the cylinder 150 at the first end portion 160. In the example shown, an interior surface of the cylinder cover 170 and an exterior surface of the cylinder 150 at its first end portion 160 form a threaded joint. A flat gasket 174 is under compression between the cylinder cover 170 and the cylinder 150 and forms a seal. The intermediate sealing sleeve 190 is sealably mated to the cylinder 150 at the second end portion 162. In the example shown, an exterior surface of the intermediate sealing sleeve 190 and an interior surface of the cylinder 150 at its second end portion 162 form a threaded joint. A flat gasket 194 is under compression between the intermediate sealing sleeve 190 and the cylinder 150 and forms a seal.

The cylinder cover 170 has an opening 172, which retains the pneumatic connector 180. A pneumatic port 184 extends longitudinally through the pneumatic connector 180. The cylinder 150 has a first end 164, in the first end portion 160, and a second end 166, in the second end portion 162. Accordingly, the pneumatic port is at the first end of the cylinder. Air or fluid enters the cylinder from the pneumatic port 184. Inside the cylinder, air or fluid first travels through the cylindrical cavity portion 154 and then a conical cavity portion 156, which tapers to an outlet port 188 at its apex. The outlet port 188 is at the second end 166 opposite the first end 164. The piston 158 is movable in the cylinder 150 between the first end 164 and the second end 166.

Figure 9:
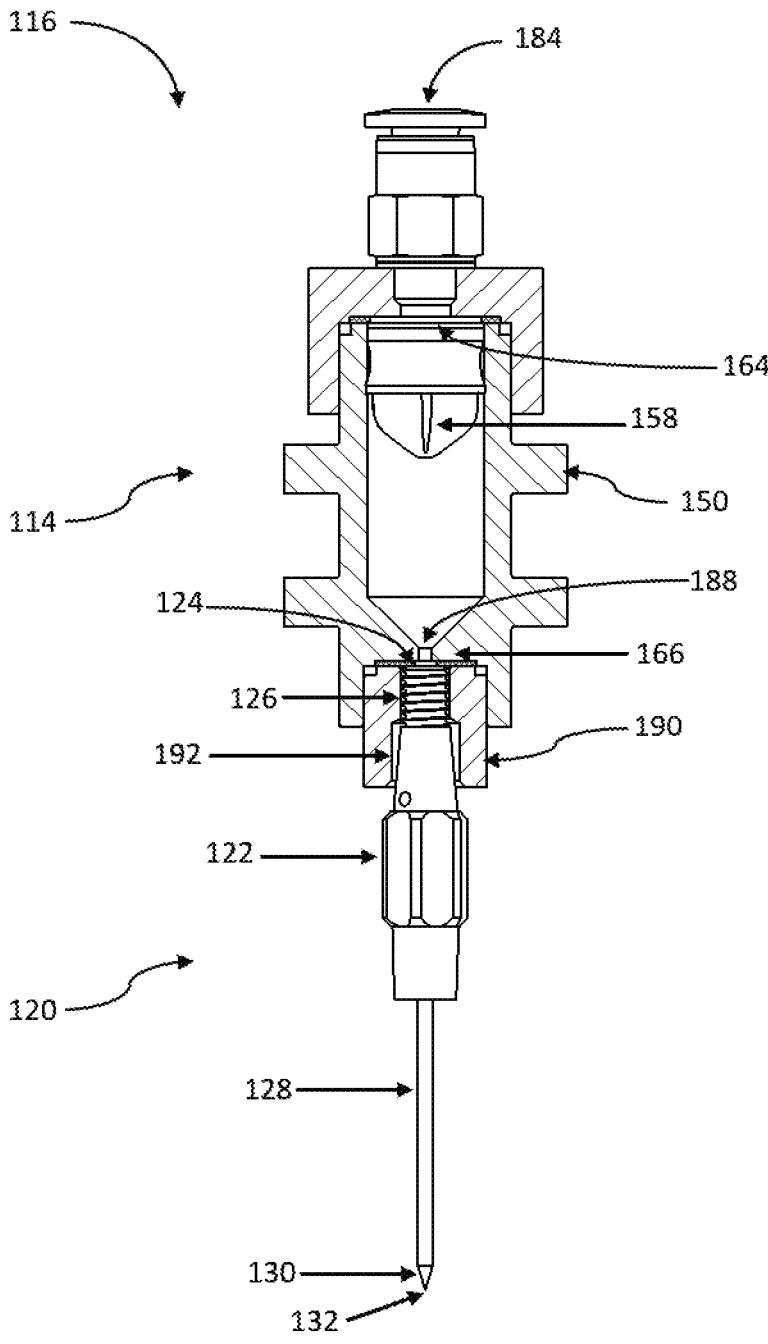
FIG. 9 is a schematic side view and partial cross-sectional view of a metallic nanoparticle composition dispenser.

FIG. 9 is a schematic side view and partial cross-sectional view of a dispenser 116. The dispenser 116 includes a piston-cylinder assembly 114 (FIG. 8) and a capillary tube 120. Capillary tube 120 has a tube inlet 124 and a tube outlet 132. Capillary tube 120 is described in greater detail with reference to FIG. 3. In the example shown, capillary tube 120 has a handle 122, including a threaded portion 126, attached to the capillary tube. The threaded portion 126 and an interior surface 192 of the intermediate sealing sleeve 190 form a threaded joint. Accordingly, the intermediate sealing sleeve retains the handle that is attached to the capillary tube. The tube inlet 124 of capillary tube 120 is coupled to the outlet port 188 at the second end 166 of the cylinder 150. At step 18, a capillary tube is installed in the piston-cylinder assembly, to form a dispenser. The dispenser is particularly suited to dispense metallic nanoparticle compositions described herein. Accordingly, the dispenser is sometimes referred to as a metallic nanoparticle composition dispenser.

Commercially available glass capillary tubes can be used in the dispenser. For example, glass capillary tubes (Eppendorf™ Femtotips™ II Microinjection Capillary Tips), having an inner diameter at the tip of 0.5 μm and an outer diameter at the tip of 0.7 μm, are available from Fisher Scientific. A commercially available glass capillary tube 120 is shown schematically in FIG. 3. The glass capillary tube has an inlet 124, and outlet 132, and an elongate fluid passageway (glass capillary tube 120) between the inlet 124 and outlet 132. A plastic handle 122 is attached to the glass capillary tube 120 around its circumference. The plastic handle 122 includes an inlet (input end) 124 and a threaded portion 126 near the inlet 124 which enables a threaded connection to an external body or external conduit (not shown in FIG. 3). The inlet 124 has an inner diameter of 1.2 mm.

Figures 4, 5:
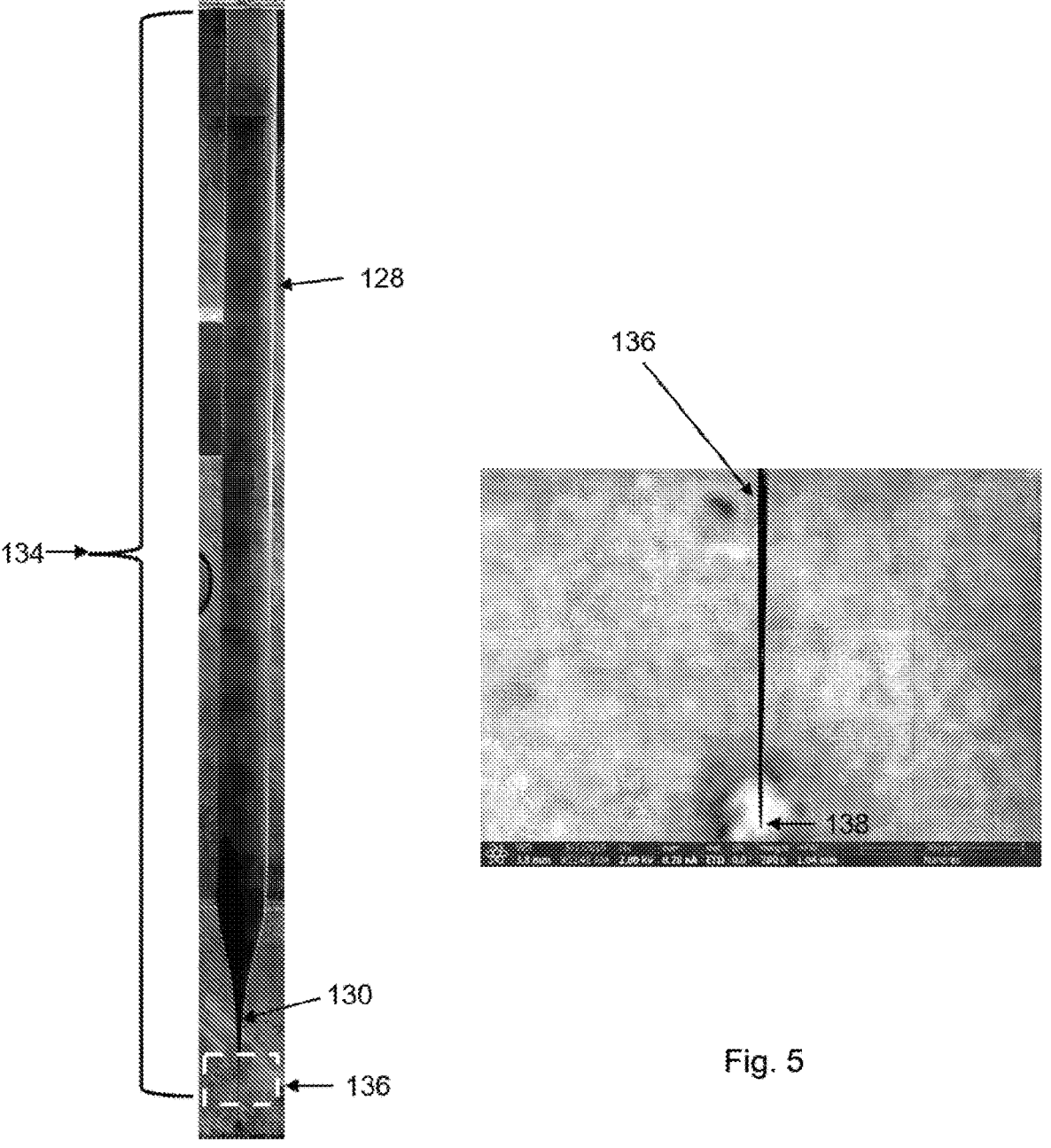
FIG. 4 is a scanning electron microscope (SEM) view of a portion of a glass capillary tube.
FIG. 5 is a scanning electron microscope (SEM) view of a tapering portion of the glass capillary tube, under low magnification.
Figure 6:
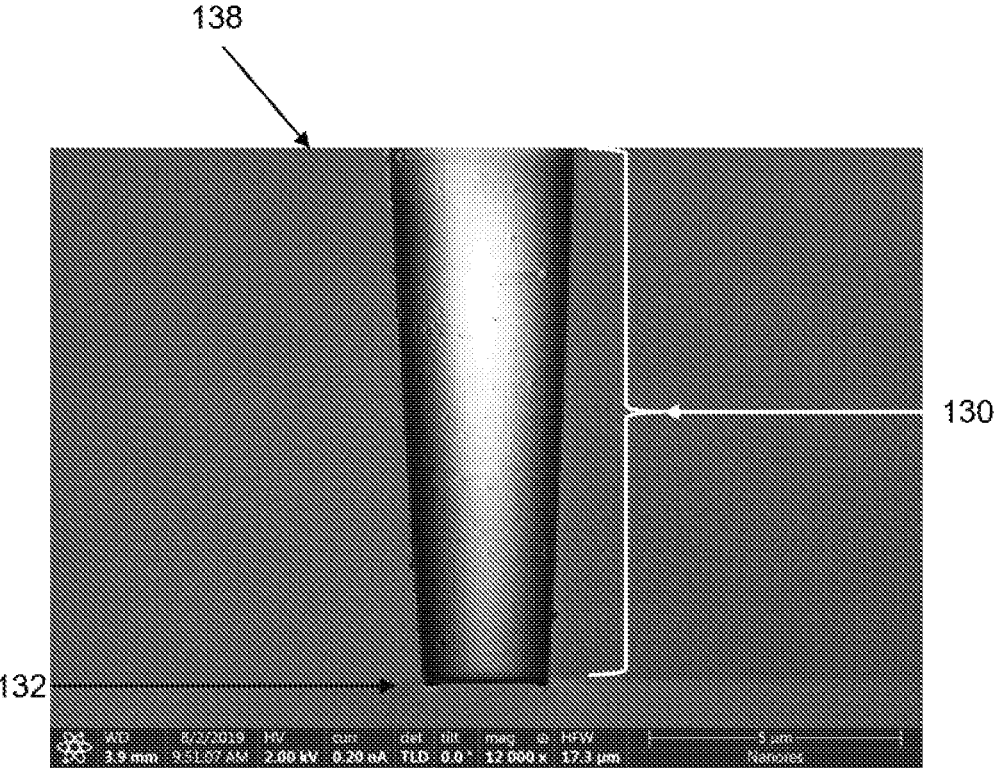
FIG. 6 is a scanning electron microscope (SEM) view of a tapering portion of the glass capillary tube, under high magnification.

The glass capillary tube includes an elongate input portion 128 and a tapering portion 130. There is an externally visible portion 134 of the glass capillary tube 120. Some of the elongate input portion 128 may be obscured by the surrounding plastic handle 122. The tapering portion 130 tapers to an outlet (output end) 132 (having an inner diameter of 0.5 μm and an outer diameter at the tip of 0.7 μm in the case of the certain Femtotips™ II Microinjection Capillary Tips). Stainless-steel capillary tubes can also be used. Stainless-steel capillary tubes with outlet inner diameter of 55 μm and 35 μm have been used. It is preferable to use capillary tubes having outlet inner diameters of 55 μm or less, or 10 μm or less. The reduction of diameter along the tapering portion 130 from the elongate input portion 128 to the outlet 132 is more clearly illustrated in FIGS. 4 through 6. FIG. 4 is a scanning electron micrograph view (formed from stitching together multiple SEM images) of the entire externally visible portion 134 of the glass capillary tube 120. A first magnification region 136 of the tapering portion 130 including the outlet 132, observed under low magnification in a scanning electron microscope (SEM), is shown in FIG. 5. Furthermore, a second magnification region 138 located within the first magnification region 136, observed under high magnification in a scanning electron microscope (SEM), is shown in FIG. 6. The outer diameter is smallest at the outlet 132 (FIG. 6) and increases with increasing longitudinal distance from the outlet 132.

Figure 7:
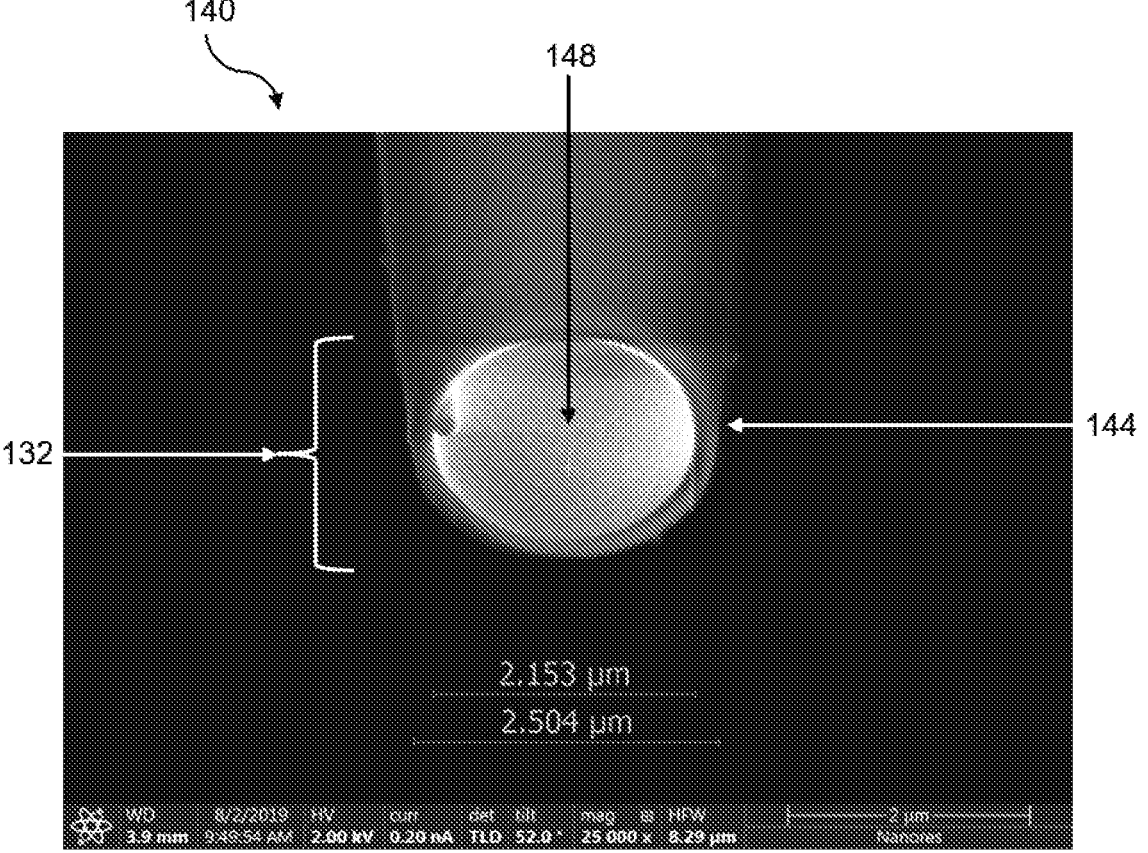
FIG. 7 is a scanning electron microscope (SEM) view of the output portion after focused-ion beam treatment, under high magnification.

In many cases it is desirable to increase the size of the outlet (outlet size). It is possible to increase the outlet size by cutting the glass capillary tube 120 at a suitable longitudinal location along the tapering portion 130. Cutting may be done using a focused-ion beam (FIB) apparatus. For example, a plasma-source Xe⁺ FIB (also called PFIB) is used. The capillary tube is installed in the FIB apparatus. A longitudinal location along the tapering portion 130 is selected, and the focused ion beam is directed to it, with sufficient energy density for cutting the glass tube. A cut is made using the focused-ion beam across the tapering portion at the selected longitudinal location. A scanning electron microscope (in the FIB apparatus) is used to measure the outer diameter or inner diameter or both at the tip. If the measured inner diameter or outer diameter or both are too small, step 156 is carried out at another longitudinal location along the tapering portion, and step 158 is carried out. In the example shown in FIG. 7, the outlet inner diameter is measured to be 2.153 μm and the outlet outer diameter is measured to be 2.504 μm. We refer to the outlet outer diameter as the outlet size. For glass capillary tubes 120, outlet sizes in a range of 700 nm to 5 μm are possible, and these outlet sizes can be used in the current printing methods.

Figure 3:
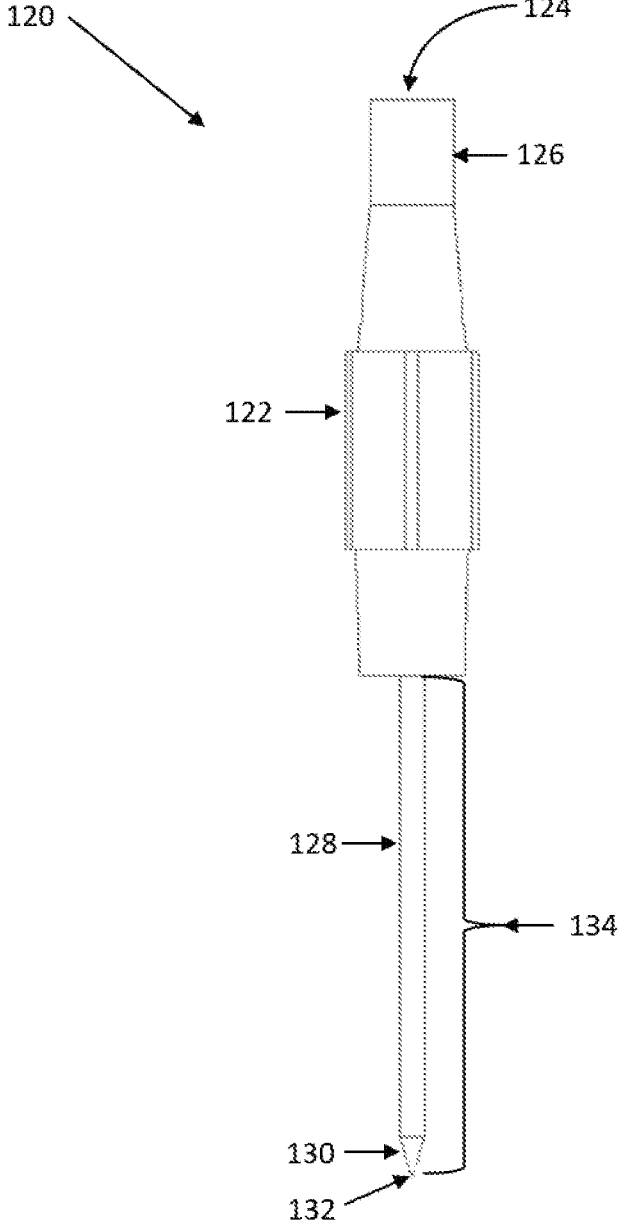
FIG. 3 is a schematic side view of a glass capillary tube.

FIG. 9 is a schematic side view and partial cross-sectional view of a metallic nanoparticle composition dispenser 116. The dispenser 116 includes a piston-cylinder assembly 114 (FIG. 8) and a capillary tube 120 (FIG. 3). Capillary tube 120 has a tube inlet (124) and a tube outlet 132. Capillary tube 120 is described in greater detail with reference to FIG. 3. In the example shown, capillary tube 120 has a handle 122, including a threaded portion 126, attached to the capillary tube. The threaded portion 126 and an interior surface 192 of the intermediate sealing sleeve 190 form a threaded joint. Accordingly, the intermediate sealing sleeve retains the handle that is attached to the capillary tube. The tube inlet 124 of capillary tube 120 is coupled to the outlet port 188 at the second end 166 of the cylinder 150.

At step 20, the metallic nanoparticle composition is injected into the cylinder 150. In the case of the piston-cylinder assembly shown in FIG. 8, this can be accomplished by injecting the metallic nanoparticle composition into the cylinder 150 via its first end 164 using a syringe, with the piston 158 removed from the cylinder and the cover 170 and the pneumatic connector 180 detached from the cylinder 150. At step 22, the piston is positioned in the cylinder. Additionally, in the example shown in FIG. 8, the cylinder cover 170 and the pneumatic connector 180 are attached to the cylinder 150 at step 22.

Figure 2:
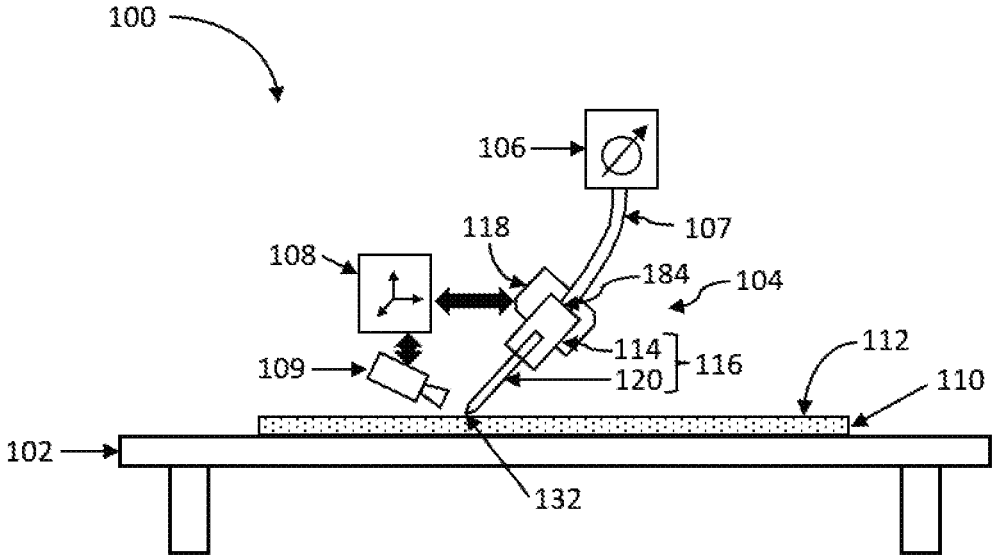
FIG. 2 is a block diagram view of an illustrative fluid printing apparatus.

At step 24, the pneumatic port 184 is coupled to a regulated pneumatic system. The fluid printing apparatus is prepared at this step if it has not been prepared previously. FIG. 2 is a block diagram view of an illustrative fluid printing apparatus. The fluid printing apparatus 100 includes a substrate stage 102, a print head 104, a regulated pneumatic system 106, and a print head positioning system 108. The fluid printing apparatus 100 can also include an imaging system 109, electronically coupled to the print head positioning system 108. A substrate 110 is fixed in position on the substrate stage 102 during the printing (dispensing) and has a printable surface 112, which is facing upward and facing towards the print head 104. The print head 104 is positioned above the substrate 110. The print head 104 includes a metallic nanoparticle composition dispenser 116 and a cartridge holder (dispenser holder) 118. The metallic nanoparticle composition dispenser 116 includes a piston-cylinder assembly 114 and a capillary tube 120, as described with reference to FIG. 9. Typically, the regulated pneumatic system 106 includes a pump and a pressure regulator. In the example shown in FIG. 2, the pneumatic port 184 of the piston cylinder assembly 114 is coupled to the regulated pneumatic system 106 via tubing 107. Preferably, the regulated pneumatic system 106 is capable of applying pressure in a range of 0 to 6 bar to the pneumatic port 184.

Figure 10:
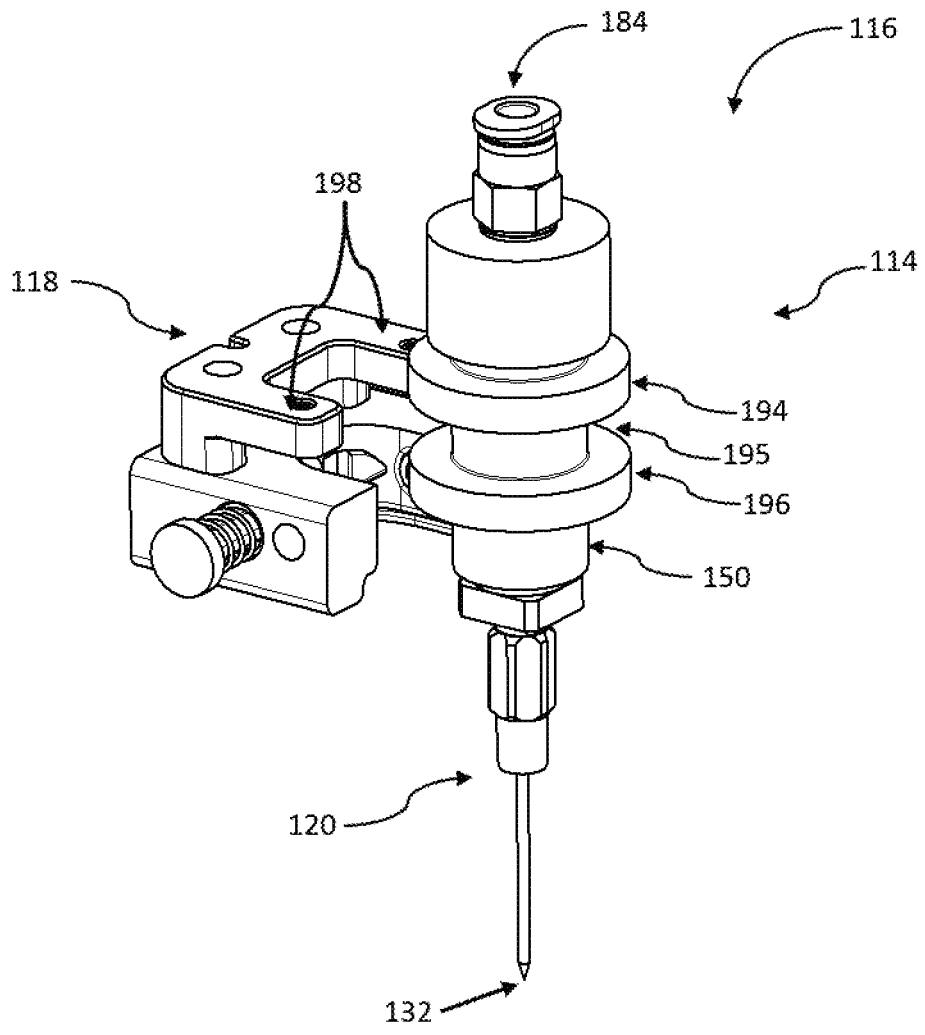
FIG. 10 is a schematic perspective view of a metallic nanoparticle composition dispenser and an associated dispenser holder.

FIG. 10 is a schematic perspective view of a metallic nanoparticle composition dispenser 114 and an associated dispenser holder 118. The dispenser holder 118 includes a fork 198. When assembled, the fork is inserted into a groove 195 between two annular protrusions 194, 196 that protrude radially outward from the outer walls of the cylinder 150. Accordingly, the dispenser holder 118 retains the dispenser. The dispenser holder 118 is mechanically coupled to the print head positioning system 108.

Figure 11:
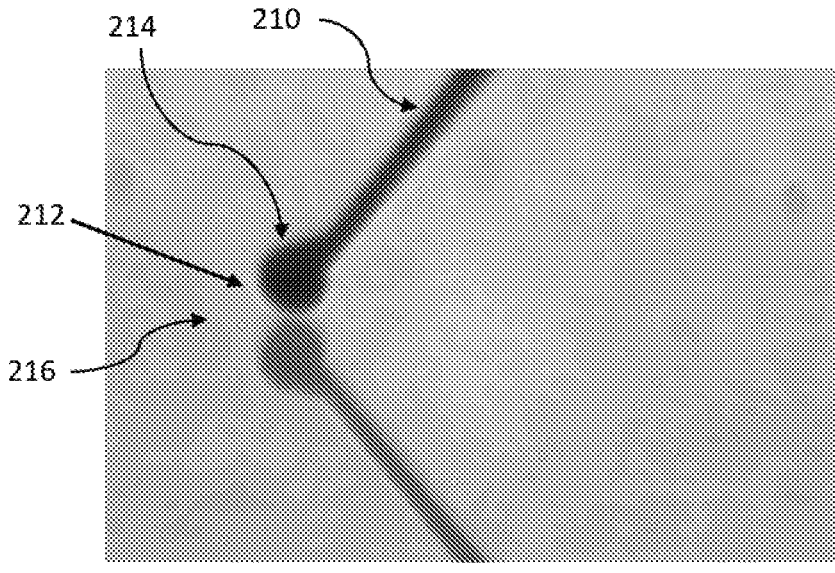
FIG. 11 is an image of an outlet portion of a dispenser suspended above a glass substrate, using a silver nanoparticle composition according to Comparative Example 2.
Figure 12:
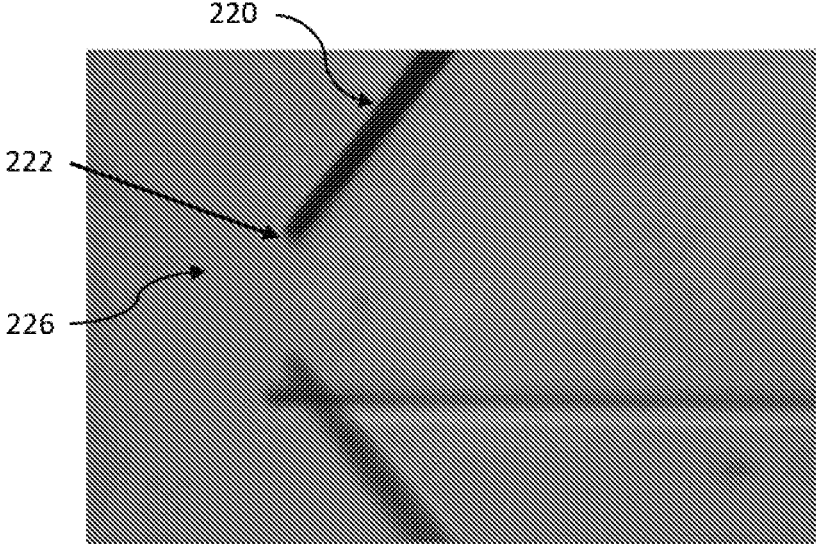
FIG. 12 is an image of an outlet portion of a dispenser suspended above a glass substrate, using a silver nanoparticle composition according to Example 1.

As shown in FIG. 2, the imaging system 109 captures images of the capillary tube outlet 132 and a portion of the substrate's printable surface 112 near the capillary tube outlet 132. The imaging system 109 is used to monitor a vertical distance between the capillary tube outlet 132 and the printable surface 112 of the substrate 110. The print head positioning system 108 controls the vertical displacement of the print head 104 and the lateral displacement of the print head 104 relative to the substrate. FIGS. 11 and 12 are examples of images that are captured by the imaging system. FIGS. 11 and 12 are images of outlet portions 210, 220 of a metallic nanoparticle composition dispenser suspended above a glass substrate 216, 226.

Figures 13, 14:
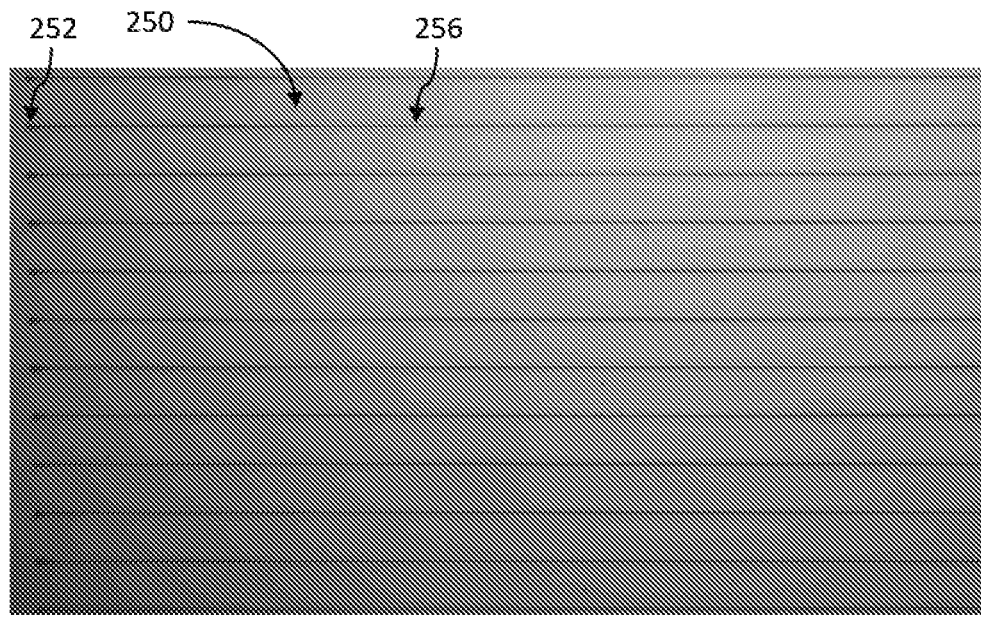
FIGS. 13 and 14 are topographic views of twelve metallic nanoparticle lines formed on a glass substrate, using a silver nanoparticle composition according to Example 2.
Figure 15:
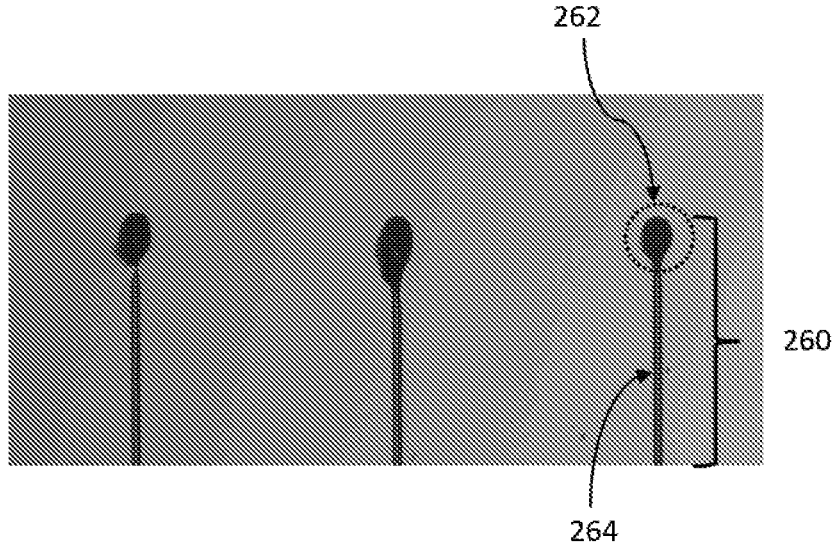
FIG. 15 is a topographic view of portions of three metallic nanoparticle lines formed on a glass substrate, using a silver nanoparticle composition according to Comparative Example 2.

At step 26, a metallic nanoparticle features are formed by dispensing a metallic nanoparticle composition on the printable surface of the substrate. The dispensing is carried out using the fluid printing apparatus. The piston, under pneumatic actuation by the regulated pneumatic system, extrudes the metallic nanoparticle composition through the capillary tube. Under the applied pressure, the metallic nanoparticle composition flows out from the capillary tube outlet. For example, the metallic nanoparticle features are metallic nanoparticle lines, as shown in FIGS. 13, 14, and 15.

According to method 10, a metallic nanoparticle composition dispenser including a piston-cylinder assembly is used to dispense the metallic nanoparticle composition. According to this method, regulated pressure is applied to the piston in the piston-cylinder assembly, and the piston extrudes the metallic nanoparticle composition. According to a previously developed method, a regulated pressured is applied directly to a metallic nanoparticle composition in a nozzle. It has been found that metallic nanoparticle features formed using this previously developed method contain deformities caused by air bubbles. Metallic nanoparticle features formed according to method 10 have a low or negligible occurrence of deformities caused by air bubbles.

The print head positioning system 108 controls the vertical displacement of the print head 104 and the lateral displacement of the print head 104 relative to the substrate. During dispensing of the metallic nanoparticle composition onto the substrate, the print head 104 is moved laterally from a start position (for example, start point 252 in FIG. 15) to the end position (for example, end point 254 in FIG. 16). During the dispensing, the capillary tube 120 and the piston-cylinder assembly are held at an angle ranging between approximately 40° and 50°, or approximately 45°, from the plane of the substrate 110, such that the print head 104 runs ahead of the capillary tube outlet. During dispensing of the metallic nanoparticle composition onto the substrate, the print head positioning system 108 maintains a vertical distance between the nozzle outlet and substrate surface in a range of approximately 1 μm and 10 μm.

At step 28, the sample (including the substrate, the metallic nanoparticle feature, and any other existing features on the substrate) are processed. This processing can include drying followed by sintering. Samples can be dried in an atmosphere of air or in a protective atmosphere such as nitrogen. Samples can be dried in two stages: (1) in 70° C. for 10 min; and (2) in 130° C. for 10 min, for a total drying time of 20 min. In an atmosphere of nitrogen, samples can be dried in one stage: in 150° C. for 15 min. After the drying, the sample can be sintered. The sintering can be photonic sintering or thermal sintering. Thermal sintering is carried out by heating in an oven in a protective atmosphere. Typically, the oven temperature is controlled within a range of 350° C. to 450° C. Examples of protective atmospheres are: Argon, Nitrogen, and a mixture of Hydrogen (5 vol. %) and Nitrogen (95 vol. %). Photonic sintering can be carried out using a laser or a flash lamp. If a laser is used, emission wavelengths of 1064 nm and 532 nm have been effective. The laser can be operated in continuous-wave mode or pulsed mode.

Certain improved metallic nanoparticle compositions have been developed as described hereinbelow. The physicochemical properties (molecular weight, boiling point, viscosity, number of hydroxyl groups, and surface tension) of solvents considered are summarized in Table 1. The solvents are all non-aqueous polar protic solvents, with 2 hydroxyl groups in the molecular structure. The boiling point ranges from 187.4° C. (propylene glycol) to 329.7° C. (tetraethylene glycol), and the viscosity ranges from 49.0 cP (triethylene glycol) to 58.3 cP (tetraethylene glycol).

TABLE 1

| Solvent | Molecular weight | Boiling point (° C.) (760 mm Hg) | Viscosity (cP) (20° C.) | No. of hydroxyl groups | Surface tension (mN/m) | Examples |
|---|---|---|---|---|---|---|
| Propylene Glycol | 76.09 | 187.4 | 56.0 | 2 | 36 | Comparative Examples 1, 2, 3 |
| Triethylene Glycol | 150.17 | 288.0 | 49.0 | 2 | 45.5 | Examples 1, 2, 3, 4 |
| Tetraethylene Glycol | 194.23 | 329.7 (decomposes) | 58.3 | 2 | 44.0 | |

Several different metallic nanoparticle compositions have been considered. Example compositions are summarized in Table 2 below. The compositions of Comparative Examples 1, 2, 3, 4, and Examples 1 and 2 contain silver nanoparticles (average nanoparticle size of 45 nm). The compositions of Examples 3 and 4 contain copper nanoparticles (average nanoparticle size of 90 nm). In the Comparative Examples 1, 2, and 3, propylene glycol is used as the solvent. In the Examples 1, 2, 3, and 4, triethylene glycol is used as the solvent. Additionally, the compositions of Comparative Examples 2 and 3 and Examples 2 and 4 contain a dispersing agent at a concentration in a range of approximately 1 wt % and 3 wt %. The dispersing agent used is an alkylol ammonium salt of a copolymer with acidic groups.

TABLE 2

| Composition | NP Metal | Metal concentration (wt %) | Solvent | Other additives |
|---|---|---|---|---|
| Comp. Example 1 | Ag | 76~80 | Propylene Glycol (PG) | None |
| Comp. Example 2 | Ag | 75~79 | Propylene Glycol (PG) | Dispersing agent 1 wt % |
| Comp. Example 3 | Ag | 73~77 | Propylene Glycol (PG) | Dispersing agent 3 wt % |

TABLE 2-continued

| Composition | NP Metal | Metal concentration (wt %) | Solvent | Other additives |
|---|---|---|---|---|
| Example 1 | Ag | 76~80 | Triethylene Glycol (TEG) | |
| Example 2 | Ag | 79~83 | Triethylene Glycol (TEG) | Dispersing agent 2 wt % |
| Example 3 | Cu | 80~82 | Triethylene Glycol (TEG) | |
| Example 4 | Cu | 82~84 | Triethylene Glycol (TEG) | Dispersing agent 2 wt % |

FIG. 11 is an image of an outlet portion 210 of a metallic nanoparticle composition dispenser suspended above a glass substrate 216. The metallic nanoparticle composition of Comparative Example 2 (Ag in propylene glycol, includes dispersing agent at 1 wt %) was used. A droplet 214 of the composition is clearly visible at the tip (outlet) 212. A pressure sufficient for droplet formation is applied to the dispenser, in a range of 5 bar to 12 bar, for example. Preferably, pressures sufficient for droplet formation are applied to the dispenser at all times, including times when no metallic nanoparticle composition is being dispensed onto a substrate, in order to reduce the occurrence of clogging of the composition in the capillary tube. If pressures sufficient for droplet formation are not applied and no droplet is formed at the outlet, the outlet of the capillary tube will dry quickly and the capillary tube will likely get clogged permanently. It would be preferable to reduce the occurrence of clogging in the capillary tubes.

FIG. 12 is an image of an outlet portion 220 of a metallic nanoparticle composition dispenser suspended above a glass substrate 226. The metallic nanoparticle composition of Example 1 (Ag in triethylene glycol) was used. There is no droplet visible at the tip (outlet) 222. In the example shown in FIG. 12, the pressure applied to the dispenser is in a range of 0 bar to 5 bar, for example. Even though there is no droplet visible, the occurrence of clogging in the capillary tube is substantially reduced compared to the example shown in FIG. 11. Because of the higher boiling point of triethylene glycol (boiling point 288.0° C.) compared to propylene glycol (boiling point 187.4° C.), metallic nanoparticle compositions containing triethylene glycol as the solvent (Examples 1, 2, 3, and 4) dry more slowly than metallic nanoparticle compositions containing propylene glycol as the solvent (Comparative Examples 1, 2, 3). When the solvent of a metallic nanoparticle composition is changed from propylene glycol to triethylene glycol, the capillary tubes become less susceptible to clogging and as a result have longer useful lifetimes. Similarly, capillary tubes are less susceptible to clogging and have longer useful lifetimes when metallic nanoparticle compositions contain tetraethylene glycol (see Table 1) as the solvent.

FIGS. 13 and 14 are topographic views of twelve metallic nanoparticle lines (250) formed on a glass substrate, using an improved metallic nanoparticle composition (Example 2 composition, Ag in TEG, dispersing agent 2 wt %). The capillary tube had an outlet outer diameter of 5 μm. The dispensing conditions were as follows: pressure applied during dispensing 5 bar, printing speed 0.1 mm/sec, and length of line 2000 μm. There was no clogging of the capillary tube during the dispensing of these silver nanoparticle lines. FIG. 13 is a topographic view of the silver nanoparticle lines 250 including the start point 252 (point at which dispensing of the line begins) of each silver nanoparticle line 250. FIG. 14 is a topographic view of the silver nanoparticle lines 250 including the end point 254 (point at which dispensing of the line ends) of each silver nanoparticle line 250. Each silver nanoparticle line 250 includes a line portion 256 in between the start point 252 and end point 254. The average line width of line portions 256 of the silver nanoparticle lines 250 was 3.65 μm with a standard deviation of 0.19 μm.

FIG. 15 is a topographic view of portions of three silver nanoparticle lines formed on a glass substrate using a silver nanoparticle composition according to Comparative Example 2 (Ag in propylene glycol). The capillary tube had an outlet outer diameter of 5 μm. The dispensing conditions were as follows: pressure applied during dispensing 7 bar, printing speed 0.1 mm/sec. Each silver nanoparticle line 260 including a start portion 262 and a line portion 264 are shown. The start portions 262 have a line width of approximately 22 μm and the line portions 264 have a line width of approximately 6.3 μm. Accordingly, a ratio of the start portion line width to the line portion line width is approximately 3.5. A line width of the start portion 262 is quite large relative to the line width of the line portion 264, because a droplet of the composition is formed at the capillary tube outlet before dispensing begins. This droplet is dispensed onto the substrate at start portion 262.

Figure 16:
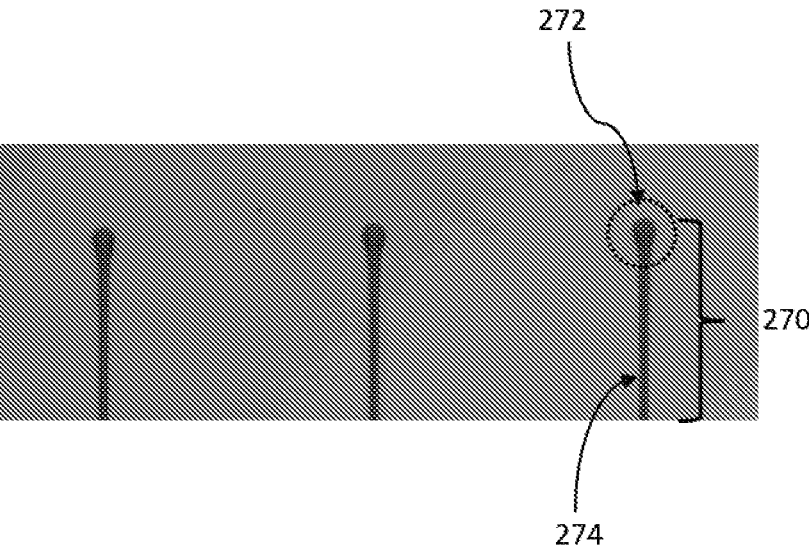
FIG. 16 is a topographic view of portions of three metallic nanoparticle lines formed on a glass substrate, using a silver nanoparticle composition according to Example 2.

FIG. 16 is a topographic view of portions of three silver nanoparticle lines formed on a glass substrate using a silver nanoparticle composition according to Example 2 (Ag in triethylene glycol). The capillary tube had an outlet outer diameter of 5 μm. The dispensing conditions were as follows: pressure applied during dispensing 7 bar, printing speed 0.25 mm/sec. Each silver nanoparticle line 270 including a start portion 272 and a line portion 274 are shown. The start portions 272 have a line width of approximately 12.2 μm and the line portions 274 have a line width of 4.1 μm. Accordingly, a ratio of the start portion line width to the line portion line width is approximately 3. This ratio is lower than the corresponding ratio from the Comparative Example 2 composition of FIG. 15. There is no droplet formed at the capillary tube outlet before the dispensing begins. Therefore, the improved metallic nanoparticle compositions enable the dispensing of metallic nanoparticle features with reduced line width variations.

Figure 17:
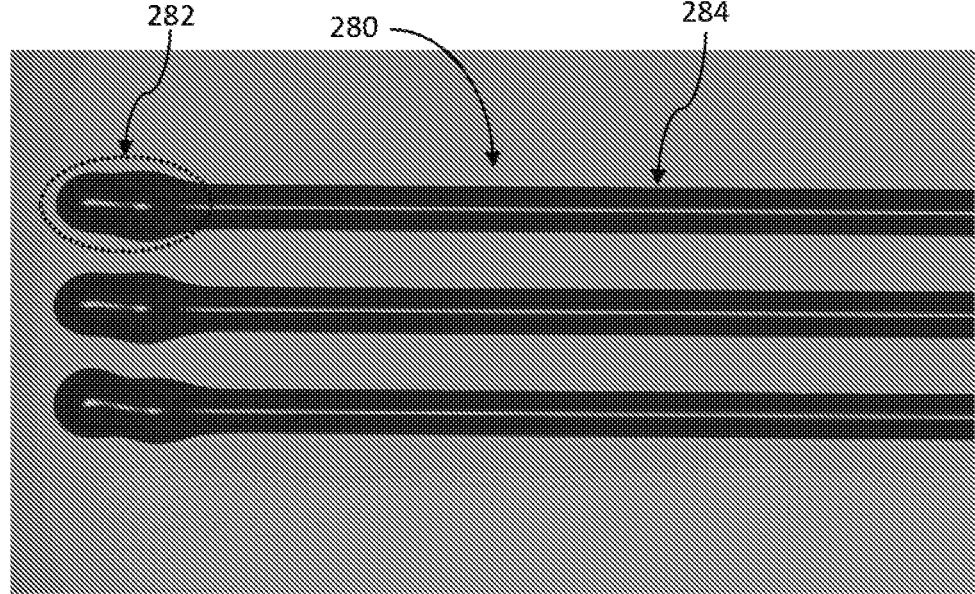
FIG. 17 is a topographic view of portions of three metallic nanoparticle lines formed on a glass substrate, using a copper nanoparticle composition according to Example 3.

FIG. 17 is a topographic view of portions of three silver nanoparticle lines formed on a glass substrate using a copper nanoparticle composition according to Example 3 (Cu in triethylene glycol). The capillary tube had an outlet outer diameter of 8 μm. The dispensing conditions were as follows: pressure applied during dispensing 2 bar, printing speed 0.1 mm/sec. Each copper nanoparticle line 280 including a start portion 282 and a line portion 284 are shown. The start portions 282 have a line width of 72.5 μm and the line portions 284 have a line width of 48.3 μm. Accordingly, a ratio of the start portion line width to the line portion line width is approximately 1.5.

In the examples shown in FIGS. 13, 14, 15, 16, and 17, metallic nanoparticle compositions are dispensed on a (bare) glass substrate. In some cases, metallic nanoparticle features are formed on other existing features of circuit elements or optoelectronic devices previously formed on the substrate. In such cases, the printable surface (112 of FIG. 2) may be silicon nitride ($SiN_x$) or silicon dioxide ($SiO_2$) instead of a bare substrate (e.g., bare glass substrate). Contact angles of water on silicon nitride and silicon dioxide surfaces are greater than contact angles on glass. Typically, dispensing of metallic nanoparticle compositions (solids concentration less than 60 wt %) is more difficult on silicon nitride and silicon dioxide surfaces than on a glass surface. However, it has been found that the improved metallic nanoparticle compositions (e.g., Examples 1, 2, 3, and 4 compositions) can be dispensed on silicon nitride or silicon dioxide surfaces with good line width homogeneity and a large window of permissible processing conditions.

Metallic nanoparticle compositions suitable for use in piston-cylinder assemblies 114, metallic nanoparticle composition dispensers 116, and in a method of dispensing a metallic nanoparticle composition 10 include metallic nanoparticles and a non-aqueous polar protic solvent having two hydroxyl groups, a first boiling point of at least 280° C. at 760 mm Hg, and a first viscosity in a range of 45 cP to 65 cP at 20° C. Polyvinylpyrrolidone is present on the metallic nanoparticle surfaces. A concentration of metals in the metallic nanoparticle composition is in a range of 60 wt % to 90 wt %. Preferably, the concentration of metals in the metallic nanoparticle composition is in a range of 76 wt % to 84 wt %. Preferably, the non-aqueous polar protic solvent is triethylene glycol or tetraethylene glycol.

Generally, these metallic nanoparticle compositions are highly viscous and exhibit shear-thinning behavior. Viscosities of several silver nanoparticle compositions (average particle size in a range of 20 nm to 80 nm) and several copper nanoparticle compositions (average particle size in a range of 60 nm to 160 nm) were measured using a viscometer at different shear rates, expressed in units of inverse seconds (sec-1). Representative viscosity measurement results for metallic nanoparticle compositions in triethylene glycol (TEG) are shown in Table 3. In the copper nanoparticle composition containing dispersing agent, the dispersing agent used is an alkylol ammonium salt of a copolymer with acidic groups. Metals and PVP would be included in the solids concentration shown in Table 3. Accordingly, a solids concentration of 60 wt % may correspond to a metals concentration of 58% for silver nanoparticle compositions (average particle size in a range of 20 nm to 80 nm, metals concentration of at least 60 wt %, solvent is TEG), viscosity measurements can be performed under a shear rate in a range of 0.2 $sec^{-1}$ to 1.0 $sec^{-1}$, for example. Under such conditions, a viscosity of the silver nanoparticle composition would be at least $2.0 \times 10^4$ cP at 25° C. Viscosities greater than $9 \times 10^4$ cP cannot be measured on our existing viscometer. We have estimated, by numerical modeling, the viscosities of silver nanoparticle compositions at higher concentrations as follows: viscosity of approximately $2.3 \times 10^6$ cP at a solids concentration of 70 wt %, and viscosity of approximately $1.0 \times 10^9$ cP at a solids concentration of 80 wt %. For copper nanoparticle compositions (average particle size in a range of 60 nm to 160 nm, metals concentration of at least 60 wt %, solvent is TEG), viscosity measurements can be performed under a shear rate in a range of 3.0 $sec^{-1}$ to 4.0 $sec^{-1}$, for example. Under such conditions, a viscosity of the copper nanoparticle composition would be at least $0.5 \times 10^3$ cP at 25° C.

Additionally, for copper nanoparticle compositions containing no dispersing agent, the viscosity would be at least $1.8 \times 10^3$ cP at 25° C.

It is preferable that a concentration of solvents having a boiling point of less than 280° C. at 760 mm Hg (1.01 bar) be low. The concentration of such solvents, in aggregate, does not exceed 3 wt % and preferably does not exceed 1 wt %. Such lower-boiling point solvents include water, methanol, and ethanol.

TABLE 3

| NP Metal | Solids Concentration (wt %) | Solvent | Other additives | Shear Rate ($sec^{-1}$) | Viscosity (cP) |
|---|---|---|---|---|---|
| Ag | 59 | TEG | None | 0.2 | 66420 ± 930.2 |
| | | | | 0.4 | 42230 ± 465.1 |
| Cu | 60 | TEG | None | 1.0 | 2698 ± 186.0 |
| | | | | 2.0 | 2344 ± 93.02 |
| | | | | 3.0 | 1957.3 ± 62.01 |
| | | | | 4.0 | 1985.7 ± 46.51 |
| Cu | 62 | TEG | Dispersing agent 2 wt % | 3.0 | 706.9 ± 62.01 |
| | | | | 4.0 | 623.2 ± 46.51 |

As explained in the foregoing discussion, the metallic nanoparticle composition can include silver nanoparticles or copper nanoparticles. Preferably, the silver nanoparticles can have an average particle size in a range of 20 nm to 80 nm. Preferably, the copper nanoparticles can have an average particle size in a range of 60 nm to 160 nm.

The metallic nanoparticle composition can additionally include a dispersing agent. The concentration of the dispersing agent should not exceed 3 wt %. For example, the dispersing agent can include an alkylol ammonium salt of a copolymer with acidic groups.

It has been found that metallic nanoparticle compositions containing titanium precursor compounds can better withstand high temperature sintering during the processing step (step 28) after the step of dispensing the metallic nanoparticle composition (step 26). A concentration of the titanium precursor compounds in the metallic nanoparticle compositions should not exceed 5 wt %. Preferably, the titanium precursor compound is a titanium alkoxide. Preferably, the titanium alkoxide is selected from the following: titanium (IV) butoxide and titanium (IV) isopropoxide.

The metallic nanoparticle composition can optionally include a second solvent. The second solvent should be a polar protic solvent having two hydroxyl groups, a boiling point of at least 280° C. at 760 mm Hg, and a viscosity in a range of 45 cP to 65 cP at 20° C. The second solvent should be different from the first solvent. For example, the first solvent is triethylene glycol and the second solvent is tetraethylene glycol.

EXAMPLES

Comparative Example 1: Silver Nanoparticle Paste Composition (80 wt %) in Propylene Glycol Reagents:
  $AgNO_3$—12.5g
  PVP (K30 grade)—100.1 g
  Ethylene glycol—560 ml
  Acetone—1520 ml
  Ethanol 96%—300 ml
  Propylene glycol—2 ml
1) Synthesis
  Two synthesis reactions were done in parallel. For each synthesis reaction: $AgNO_3$ (12.5 g) was dissolved in 50 ml of Ethylene Glycol at room temperature. In a three-necked flask, PVP (100.2 g) was dissolved in 250 ml of Ethylene Glycol, under reflux, while heating at 140° C. AgNO$_3$ solution was poured in a quick movement (via funnel) into hot PVP dissolved in Ethylene Glycol. Mixtures were heated at 140° C. for 60 min under vigorous stirring. Finally, cooled in cold water bath until room temperature was reached.

2) Purification

Mixture from each synthesis was poured into a 2.5 liter beaker. 100 ml of Ethylene Glycol was added to the three-necked reaction flask, sonicated for 1 min under stirring and pooled with the previously mentioned fraction. 1440 ml of Acetone and 160 ml of Ethylene Glycol were mixed in a 2 liter beaker and poured into the beaker containing the Ag nanoparticles (NPs) suspension, under stirring first at 500 rpm, then 900 rpm. Another 40 ml of acetone was then added, then another 40 ml of acetone was added. There was a change in the color of the solution from dark green to brown. The contents of the beaker were poured equally into six 500 ml centrifuge bottles and were centrifuged for 15 min @ 4000×g. Clear orange supernatants were discarded. Silver pellets were re-dispersed in 40 ml of ethanol (per bottle) under sonication and shaking (10 min). The solution were poured into two bottles (120 ml per bottle), followed by centrifugation for 35 min @ 11000×g. The pellet was then re-dispersed in 30 ml ethanol (EtOH) under sonication and shaking (10 min).

3) Formulation

Approximately 120 ml of obtained dispersion were transferred into a syringe and filtered through 1.0 μm polyamide (PA) filter directly into round-bottom flask. 2.0 ml of propylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 μm polyvinylidene fluoride (PVDF) filter directly into 5 ml polyethylene (PE) syringe (filled from top). Obtained dispersion is estimated to have a solid content concentration of 80 wt %±2 wt % (based on thermogravimetric analysis (TGA) measurement). Silver content is estimated to be in a range of 76 wt % to 80 wt % (based on inductively-coupled plasma (ICP) or atomic absorption spectroscopy (AAS) measurement).

Comparative Example 2: Silver Nanoparticle Paste Composition (80 wt %) in Propylene Glycol, Including Dispersing Agent 1 wt %

Reagents:
    AgNO$_3$—12.5 g
    PVP (K30 grade)—100.1 g
    Ethylene glycol—560 ml
    Acetone—1520 ml
    Ethanol 96%—300 ml
    Propylene glycol—1.882 ml
    Dispersing agent, alkylammonium salt of a copolymer with acidic groups—117.2 μl
1) Synthesis
    Same as Comparative Example 1.
2) Purification
    Mixture from each synthesis was poured into a 2.5 liter beaker. 100 ml of Ethylene Glycol was added to the three-necked reaction flask, sonicated for 1 min under stirring and pooled with the previously mentioned fraction. 1440 ml of Acetone and 160 ml of Ethylene Glycol were mixed in a 2 liter beaker and poured into the beaker containing the Ag NPs suspension, under stirring first at 500 rpm, then 900 rpm. Another 40 ml of acetone was then added, then another 40 ml of acetone was added. There was a change in the color of the solution from dark green to brown. The contents of the beaker were poured equally into six 500 ml centrifuge bottles and were centrifuged for 15 min @ 4000×g. Clear orange supernatants were discarded. Silver pellets were re-dispersed in 40 ml of ethanol (per bottle) under sonication and shaking (10 min). The solution were poured into two bottles (120 ml per bottle), followed by centrifugation for 35 min @ 11000×g. The pellet were individually re-dispersed in premixtures of 30 ml EtOH and 29.30 μl dispersing agent (for each of 4 bottles of the double synthesis) under sonication and shaking (10 min).

3) Formulation

Approximately 120 ml of obtained dispersion were transferred into a syringe and filtered through 1.0 μm PA filter directly into round-bottom flask. 1.882 ml of propylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 μm PVDF filter directly into 5 ml PE syringe (filled from top). Obtained dispersion is estimated to have a solid content concentration of 80 wt %±2 wt % (based on TGA measurement). Silver content is estimated to be in a range of 75 wt % to 79 wt % (based on ICP or AAS measurement). The concentration of the dispersing agent in the composition is estimated to be approximately 1 wt %.

Comparative Example 3: Silver Nanoparticle Paste Composition (80 wt %) in Propylene Glycol, Including Dispersing Agent 3 wt %

Reagents:
    AgNO$_3$—12.5 g
    PVP K30—100.1 g
    Ethylene glycol—560 ml
    Acetone—1520 ml
    Ethanol 96%—300 ml
    Propylene glycol—1.688 ml
    Dispersing agent, alkylammonium salt of a copolymer with acidic groups—311.2 μl
1) Synthesis
    Same as Comparative Example 1.
2) Purification
    Mixture from each synthesis was poured into a 2.5 liter beaker. 100 ml of Ethylene Glycol was added to the three-necked reaction flask, sonicated for 1 min under stirring and pooled with the previously mentioned fraction. 1440 ml of Acetone and 160 ml of Ethylene Glycol were mixed in a 2 liter beaker and poured into the beaker containing the Ag NPs suspension, under stirring first at 500 rpm, then 900 rpm. Another 40 ml of acetone was then added, then another 40 ml of acetone was added. There was a change in the color of the solution from dark green to brown. The contents of the beaker were poured equally into six 500 ml centrifuge bottles and were centrifuged for 15 min @ 4000×g. Clear orange supernatants were discarded. Silver pellets were re-dispersed in 40 ml of ethanol (per bottle) under sonication and shaking (10 min). The solution were poured into two bottles (120 ml per bottle), followed by centrifugation for 35 min @ 11000×g. The pellet were individually re-dispersed in premixtures of 30 ml EtOH and 77.80 μl dispersing agent (for each of 4 bottles of the double synthesis) under sonication and shaking (10 min).

3) Formulation

Approximately 120 ml of obtained dispersion were transferred into a syringe and filtered through 1.0 μm PA filter directly into round-bottom flask. 1.688 ml of propylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 μm PVDF filter directly into 5 ml PE syringe (filled from top). Obtained dispersion is estimated to have a solid content concentration of 80 wt %±2 wt % (based on TGA measurement). Silver content is estimated to be in a range of 73 wt % to 77 wt % (based on ICP or AAS measurement). The concentration of the dispersing agent in the composition is estimated to be approximately 3 wt %.

Example 1: Silver nanoparticle paste composition (80 wt %) in Triethylene Glycol Reagents:

$AgNO_3$—12.5 g
PVP (K30 grade)—100.1 g
Ethylene glycol—560 ml
Acetone—1520 ml
Ethanol 96%—300 ml
Triethylene glycol—2 ml 1) Synthesis Same as Comparative Example 1.

2) Purification

Same as Comparative Example 1.

3) Formulation

Approximately 120 ml of obtained dispersion were transferred into a syringe and filtered through 1.0 μm PA filter directly into round-bottom flask. 2.0 ml of triethylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 μm PVDF filter directly into 5 ml PE syringe (filled from top). Obtained dispersion is estimated to have a solid content concentration of 80 wt %±2 wt % (based on TGA measurement). Silver content is estimated to be in a range of 76 wt % to 80 wt % (based on ICP or AAS measurement).

Example 2: Silver Nanoparticle Paste Composition (85 wt %) in Triethylene Glycol, Including Dispersing Agent 2 wt %

Reagents:

$AgNO_3$—12.5 g
PVP (K30 grade)—100.1 g
Ethylene glycol—560 ml
Acetone—1520 ml
Ethanol 96%—300 ml
Triethylene glycol—1.326 ml
Dispersing agent, alkylammonium salt of a copolymer with acidic groups—235.2 μl 1) Synthesis Same as Comparative Example 1.

2) Purification

Mixture from each synthesis was poured into a 2.5 liter beaker. 100 ml of Ethylene Glycol was added to the three-necked reaction flask, sonicated for 1 min under stirring and pooled with the previously mentioned fraction. 1440 ml of Acetone and 160 ml of Ethylene Glycol were mixed in a 2 liter beaker and poured into the beaker containing the Ag NPs suspension, under stirring first at 500 rpm, then 900 rpm. Another 40 ml of acetone was then added, then another 40 ml of acetone was added. There was a change in the color of the solution from dark green to brown. The contents of the beaker were poured equally into six 500 ml centrifuge bottles and were centrifuged for 15 min @ 4000×g. Clear orange supernatants were discarded. Silver pellets were re-dispersed in 40 ml of ethanol (per bottle) under sonication and shaking (10 min). The solution were poured into two bottles (120 ml per bottle), followed by centrifugation for 35 min @ 11000×g. The pellet were individually re-dispersed in premixtures of 30 ml EtOH and 58.8 μl dispersing agent (for each of 4 bottles of the double synthesis) under sonication and shaking (10 min).

3) Formulation

Approximately 120 ml of obtained dispersion were transferred into a syringe and filtered through 1.0 μm PA filter directly into round-bottom flask. 1.326 ml of triethylene glycol were added. Flask was placed on rotary evaporator at 43° C., 110 mbar for 40 min and then set to 35 mbar. Time taken to reach the set pressure was 30 min, and when reached, the condition was maintained for 5 min. Paste-like composition was transferred into a syringe and filtered through a 0.45 μm PVDF filter directly into 5 ml PE syringe (filled from top). Obtained dispersion is estimated to have a solid content concentration of 85 wt %±2 wt % (based on TGA measurement). Silver content is estimated to be in a range of 79 wt % to 83 wt % (based on ICP or AAS measurement). The concentration of the dispersing agent in the composition is estimated to be approximately 2 wt %.

Example 3: Copper Nanoparticles Composition (84 wt %) in Triethylene Glycol

Reagents:

PVP (K30 grade)—100.1 g
$NaH_2PO_2 \cdot H_2O$—60.0 g
$Cu(NO_3)_2 \cdot 3H_2O$—30.0 g
Diethylene glycol—250 ml
Triethylene glycol—500 ml
DI water, methanol 99%
Dispersing agent, alkylammonium salt of a copolymer with acidic groups—180 μl 1) Synthesis PVP and sodium hypophosphite monohydrate were placed in 3000 ml beaker and mixture of 500 ml of triethylene glycol and 250 ml of diethylene glycol were added. Beaker was placed into oil bath with mechanical stirring (300 RPM). Solution was heated to 145° C. Concomitantly, 30 g of copper nitrate trihydrate in 100 ml of diethylene glycol were placed in 250 ml beaker and stirred to complete dissolution of the salt at elevated temperature of 50° C.

$Cu^{2+}$ solution was injected at rate 60 ml/min into PVP/$NaH_2PO_2$ solution @ 145° C., and kept in that temperature, under stirring for 2 minutes. Heating was turned off and beaker with hot CuNPs suspension was placed into cold water bath under stirring. After cooling down to 99° C., 1400 ml of DI water were immediately added and solution was stirred for 10 minutes.

2) Purification

After cooling down to about 50° C., obtained dispersion was divided equally to 6 centrifuge bottles, shaken well and centrifuged at 6000×g (RCF) for 15 min. Supernatant was discarded, and 80 ml of DI water with 30 μl of dispersing agent were added to every bottle. Precipitate (shiny red metallic appearance) was re-dispersed in ultrasonic bath for 10 minutes, using a glass rod for mixing. Dispersions were combined into two bottles and then centrifuged for 15 min at 11000×g.

Copper nanoparticles were re-dispersed in 60 ml/bottle of methanol, combined into 1 bottle and centrifuged again at 11000×g (RCF) for 15 min. Shiny copper cake was re-dispersed in 30 ml methanol.

3) Formulation

Obtained 30 ml of CuNPs dispersion was filtered through 0.8 μm mixed cellulose ester (MCE) syringe filter into a 100 ml round bottom plastic flask containing 0.95 ml of triethylene glycol. Dispersion was placed in a rotary evaporator for 35 minutes at 45° C. and 130 mbar and then at 35 mbar for 5 minutes. Paste was transferred into a syringe and filtered through a 0.45 μm PVDF filter directly into PE syringe (filled from top). Obtained dispersion is estimated to have a solid content concentration of 84 wt %±2 wt % (based on TGA measurement). Copper content is estimated to be in a range of 80 wt % to 82 wt % (based on ICP or AAS measurement).

Example 4: Copper Nanoparticles Paste Composition (86 wt %) in Triethylene Glycol, Including Dispersing Agent 2 wt %

Reagents:

PVP (K30 grade)—100.1 g
NaH₂PO₂·H₂O—60.0 g
Cu(NO₃)₂·3H₂O—30.0 g
Diethylene glycol—250 ml
Triethylene glycol—500 ml
DI water, methanol 99%
Dispersing agent, alkylammonium salt of a copolymer with acidic groups—270 μl 1) Synthesis Same as Example 3.

2) Purification

Same as Example 3.

3) Formulation

To obtained 30 ml of CuNPs methanol dispersion, 90 μl of dispersing agent was added. Mixture was vigorously shaken for 3 minutes and filtered through 0.8 μm MCE syringe filter into a 100 ml round bottom plastic flask containing 0.86 ml of triethylene glycol. Dispersion was placed in a rotary evaporator for 35 minutes at 45° C. and 130 mbar and then at 35 mbar for 5 minutes. Paste was transferred into a syringe and filtered through a 0.45 μm PVDF filter directly into PE syringe (filled from top). Obtained dispersion is estimated to have a solid content concentration of 86 wt %±2 wt % (based on TGA measurement). Copper content is estimated to be in a range of 82 wt % to 84 wt % (based on ICP or AAS measurement). The concentration of the dispersing agent in the composition is estimated to be approximately 2 wt %.

What is claimed is:

1. A metallic nanoparticle composition, comprising:
metallic nanoparticles; and
a first non-aqueous polar protic solvent having two hydroxyl groups, a first boiling point of at least 280° C. at 760 mm Hg, and a first viscosity in a range of 45 cP to 65 cP at 20° C.; wherein the metallic nanoparticles comprise silver nanoparticles;
polyvinylpyrrolidone is present on surface of the metallic nanoparticle;
a concentration of metals in the metallic nanoparticle composition is in a range of 60 wt % to 90 wt %;

a concentration, in aggregate, of solvents having a boiling point of less than 280° C. at 760 mm Hg in the metallic nanoparticle composition does not exceed 3 wt %; and
a viscosity of the metallic nanoparticle composition, measured under a shear rate in a range of 0.2 sec⁻¹ to 1.0 sec⁻¹, is at least 2.0×10⁴ cP at 25° C.

2. The metallic nanoparticle composition of claim 1, wherein the concentration, in aggregate, of solvents having a boiling point of less than 280° C. at 760 mm Hg in the metallic nanoparticle composition does not exceed 1 wt %.

3. The metallic nanoparticle composition of claim 2, wherein the solvents having a boiling point of less than 280° C. at 760 mm Hg are selected from the group consisting of: water, methanol, and ethanol.

4. The metallic nanoparticle composition of claim 1, wherein the silver nanoparticles have an average particle size in a range of 20 nm to 80 nm.

5. The metallic nanoparticle composition of claim 1, wherein the first non-aqueous polar protic solvent is triethylene glycol or tetraethylene glycol.

6. The metallic nanoparticle composition of claim 1, further comprising a dispersing agent, at a concentration in the metallic nanoparticle composition that does not exceed 3 wt %.

7. The metallic nanoparticle composition of claim 6, wherein the dispersing agent comprises an alkylol ammonium salt of a copolymer with acidic groups.

8. The metallic nanoparticle composition of claim 1, further comprising a titanium precursor compound, at a concentration that does not exceed 5 wt %.

9. The metallic nanoparticle composition of claim 8, wherein the titanium precursor compound is a titanium alkoxide.

10. The metallic nanoparticle composition of claim 9, wherein the titanium alkoxide is selected from the group consisting of: titanium (IV) butoxide and titanium (IV) isopropoxide.

11. The metallic nanoparticle composition of claim 1, further comprising:
a second non-aqueous polar protic solvent having two hydroxyl groups, a second boiling point of at least 280° C. at 760 mm Hg, and a second viscosity in a range of 45 cP to 65 cP at 20° C.;
wherein the second non-aqueous polar protic solvent is different from the first non-aqueous polar protic solvent.

12. The metallic nanoparticle composition of claim 11, wherein the first non-aqueous polar protic solvent is triethylene glycol and the second non-aqueous polar protic solvent is tetraethylene glycol.

13. The metallic nanoparticle composition of claim 1, wherein the concentration of metals in the metallic nanoparticle composition is in a range of 76 wt % to 84 wt %.

14. A method of dispensing the metallic nanoparticle composition of claim 1 on a substrate, the method comprising:
providing a cartridge comprising a pneumatic port at first end, an outlet port at a second end opposite the first end;
providing a capillary tube having a tube inlet and a tube outlet;
coupling the tube inlet to the outlet port;
injecting the metallic nanoparticle composition into the cartridge;
coupling the pneumatic port to a regulated pneumatic system; and

19 extruding the metallic nanoparticle composition through the capillary tube under actuation by the regulated pneumatic system.

15. The method of claim 14, wherein the concentration, in aggregate, of solvents having a boiling point of less than 280° C. at 760 mm Hg in the metallic nanoparticle composition does not exceed 1 wt %.

16. The method of claim 15, wherein the solvents having a boiling point of less than 280° C. at 760 mm Hg are selected from the group consisting of: water, methanol, and ethanol.

17. The method of claim 14, wherein the first non-aqueous polar protic solvent is triethylene glycol or tetraethylene glycol.

18. The method of claim 14, wherein the metallic nanoparticle composition further comprises a titanium precursor compound, at a concentration that does not exceed 5 wt %.

20

19. The method of claim 18, wherein the titanium precursor compound is a titanium alkoxide.

20. The method of claim 14, wherein the metallic nanoparticle composition further comprises:

a second non-aqueous polar protic solvent having two hydroxyl groups, a second boiling point of at least 280° C. at 760 mm Hg, and a second viscosity in a range of 45 cP to 65 cP at 20° C.;

wherein the second non-aqueous polar protic solvent is different from the first non-aqueous polar protic solvent.

21. The method of claim 20, wherein the first non-aqueous polar protic solvent is triethylene glycol and the second non-aqueous polar protic solvent is tetraethylene glycol.

22. The method of claim 14, wherein the concentration of metals in the metallic nanoparticle composition is in a range of 76 wt % to 84 wt %.

* * * * *